(12) United States Patent
Logan et al.

(10) Patent No.: US 10,393,784 B2
(45) Date of Patent: Aug. 27, 2019

(54) ANALYSIS OF A RADIO-FREQUENCY ENVIRONMENT UTILIZING PULSE MASKING

(71) Applicant: Raytheon Company, Waltham, MA (US)

(72) Inventors: Jeffery Jay Logan, Denver, CO (US); Harry B. Marr, Jr., Manhattan Beach, CA (US); Ian S. Robinson, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 141 days.

(21) Appl. No.: 15/497,554

(22) Filed: Apr. 26, 2017

(65) Prior Publication Data

US 2018/0313880 A1 Nov. 1, 2018

(51) Int. Cl.
| | |
|---|---|
| *G01R 29/027* | (2006.01) |
| *G01S 7/02* | (2006.01) |
| *G01R 23/15* | (2006.01) |
| *G01S 7/292* | (2006.01) |
| *G01S 7/295* | (2006.01) |

(52) U.S. Cl.
CPC ....... *G01R 29/0273* (2013.01); *G01R 23/155* (2013.01); *G01S 7/021* (2013.01); *G01S 7/292* (2013.01); *G01S 7/295* (2013.01)

(58) Field of Classification Search
CPC ..... G04R 20/10; G01R 29/0273; G01S 7/021; G06F 17/15
USPC .............................. 702/79; 368/47; 708/422
See application file for complete search history.

(56) References Cited

U.S. PATENT DOCUMENTS

| | | | |
|---|---|---|---|
| 4,910,526 | A | 3/1990 | Donnangelo et al. |
| 5,103,209 | A | 4/1992 | Lizzi et al. |
| 5,300,922 | A | 4/1994 | Stoffer |
| 5,502,747 | A | 3/1996 | McGrath |
| 5,563,806 | A | 10/1996 | Barry et al. |
| 5,699,382 | A | 12/1997 | Shoham et al. |
| 6,083,172 | A | 7/2000 | Baker, Jr. et al. |

(Continued)

FOREIGN PATENT DOCUMENTS

| | | |
|---|---|---|
| CA | 2217583 | 10/1996 |
| WO | WO-0051246 A2 | 8/2000 |

(Continued)

OTHER PUBLICATIONS

"International Application Serial No. PCT/US2018/029381, International Search Report dated Jul. 26, 2018", 4 pgs.

(Continued)

*Primary Examiner* — John H Le
(74) *Attorney, Agent, or Firm* — Schwegman Lundberg & Woessner, P.A.

(57) ABSTRACT

Radio-frequency (RF) signal analysis includes slow-time signal processing and fast-time signal processing. Incoming RF pulses are captured according to a resource scheduling configuration. The fast-time signal processing is to prioritize the captured RF pulses for slow-time signal processing based on dynamic pulse-grading criteria. The slow-time signal processing is to perform relevance evaluation of the prioritized RF pulses, and to adjust the dynamic pulse-grading criteria and the resource scheduling configuration based on the relevance evaluation.

25 Claims, 10 Drawing Sheets

(56) References Cited

U.S. PATENT DOCUMENTS

| | | |
|---|---|---|
| 6,310,963 B1 | 10/2001 | Erdol et al. |
| 6,394,969 B1 | 5/2002 | Lenhardt et al. |
| 6,408,275 B1 | 6/2002 | Bastin |
| 7,236,123 B2 | 6/2007 | Siegel |
| 7,302,017 B2 | 11/2007 | Wreschner et al. |
| 7,474,257 B2 | 1/2009 | Blunt et al. |
| 7,576,907 B1 | 8/2009 | Bartels et al. |
| 8,301,250 B2 | 10/2012 | Rom |
| 8,907,841 B2 | 12/2014 | Sahinoglu et al. |
| 9,074,936 B2 | 7/2015 | Nelson et al. |
| 2005/0033789 A1 | 2/2005 | Sirois |
| 2007/0140064 A1* | 6/2007 | Fujisawa ............... G04R 20/10 368/47 |

FOREIGN PATENT DOCUMENTS

| | | |
|---|---|---|
| WO | WO-2002063585 A1 | 8/2002 |
| WO | WO-2004016002 A3 | 7/2004 |
| WO | 2018200686 | 11/2018 |

OTHER PUBLICATIONS

"International Application Serial No. PCT/US2018/029381, Written Opinion dated Jul. 26, 2018", 5 pgs.

Hintze, Lon, "Keysight Solutions Catalog", Keysight Technologies, (Jan. 2015), 24 pgs.

Nguyen, Hien, "Robust Steering Vector Mismatch Techniques for Reduced Rank Adaptive Array Signal Processing (Dissertation)", Submitted to the Faculty of the Virginia Polytechnic Institute and State University, (Oct. 10, 2002), 224 pgs.

Trevor, P J, "Updating the Estimated Location of an RF Emitter and it's associated Platform", University College London, (2005), 4 pgs.

* cited by examiner

```
for i = 1:length(obj.obs{index})
    if i==1
        if obj.obs{index}(i) > 0
            obj.con{index, filterPointIndex}(i) = +0.33;
        elseif obj.obs{index}(i) < 0
            obj.con{index, filterPointIndex}(i) = -0.33;
        else
            obj.con{index, filterPointIndex}(i) = 0;
        end
        delta(i) = obj.con{index, filterPointIndex}(i);
    else
        growVal = 1;
        if obj.obs{index}(i) > 0
            if obj.obs{index}(i-1) > 0
                growVal = 2/3;
            elseif obj.obs{index}(i-1) <= 0
                growVal = 1/3;
            end
        elseif obj.obs{index}(i) < 0
            if obj.obs{index}(i-1) < 0
                growVal = -2/3;
            elseif obj.obs{index}(i-1) >= 0
                growVal = -1/3;
            end
        else
            growVal = 0;
        end
```

*FIG. 7A*

```
option1p = growVal*(1-obj.obs{index}(i-1));
option1n = -growVal*(-1-obj.obs{index}(i-1));
option2 = growVal*(obj.obs{index}(i-1));

if (obj.obs{index}(i-1) > 0 && ...
        obj.obs{index}(i) < 0 || ...
        obj.obs{index}(i) > 0 && ...
        obj.obs{index}(i-1) < 0)
    if obj.obs{index}(i-1) > 0
        delta(i) = option2;
    else
        delta(i) = -option2;
    end
else
    if obj.obs{index}(i-1) > 0 && growVal > 0
        delta(i) = option1p;
    elseif obj.obs{index}(i-1) > 0 && growVal < 0
        delta(i) = option1n;
    elseif obj.obs{index}(i-1) < 0 && growVal > 0
        delta(i) = option1p;
    else
        delta(i) = option1n;
    end
end
obj.con{index, filterPointIndex}(i) = ...
    obj.con{index, filterPointIndex}(i-1) + delta(i);
        end
    end conOut = obj.con{index, filterPointIndex};
end
```

ANALYSIS OF A RADIO-FREQUENCY ENVIRONMENT UTILIZING PULSE MASKING

TECHNICAL FIELD

Embodiments described herein generally relate to the detection, monitoring, or analysis of radio-frequency emissions and, more particularly, to methods and apparatus for performing the detection, monitoring, or analysis, of particular radio-frequency emissions of interest, in a computationally-efficient manner.

BACKGROUND

Radio-frequency (RF) environments in which signals or RF emissions of interest are to be distinguished from among other RF emissions to be detected, monitored, or analyzed, present increasingly difficult challenges for designers of signal-analysis systems. This is due in no small part to the growing utilization of the RF spectrum by the general public, whether intentionally, or unintentionally. As an example of a practical application, consider the task of threat detection, such as detection of weapons-targeting RADAR signals. Unimportant signals, such as civilian communications, civilian RADAR usage, and the like, tend to clutter the spectrum to be monitored for the presence of signals of importance (SOI). In dense RF environments signal-analysis systems may become overwhelmed, or saturated, and thus unable to keep up with processing each and every detected signal to distinguish the SOI from the non-SOI observable RF emissions.

Conventional approaches have relied on limiting the instantaneous bandwidth of signal analysis systems. As a consequence, such systems suffer in their visibility into the spectrum of interest as they commutate their instantaneous bandwidth. A practical solution is needed to facilitate the detection and analysis of signals of interest.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings.

FIGS. 7A-7B present source code as an example of the feature-grading algorithm according to an embodiment.

DETAILED DESCRIPTION

Aspects of the embodiments are directed to pulse processing systems and methods. An RF pulse in the present context is a burst of energy in the monitored RF spectrum. Sources of RF pulses include communications systems, RADAR, unintentional transmitters such as arc welding tools, other industrial equipment such as microwave ovens, plasma generators, or the like, electronic warfare signals such as jamming signal transmitters, and many others.

Aspects of the embodiments may be implemented as part of a signal-processing and computing platform. The signal-processing and computing platform may be one physical machine, or may be distributed among multiple physical machines, such as by role or function, or by process thread in the case of a cloud computing distributed model. In various embodiments, aspects of the invention may be configured to run in virtual machines that in turn are executed on one or more physical machines. It will be understood by persons of skill in the art that features of the invention may be realized by a variety of different suitable machine implementations.

Figure 1A:
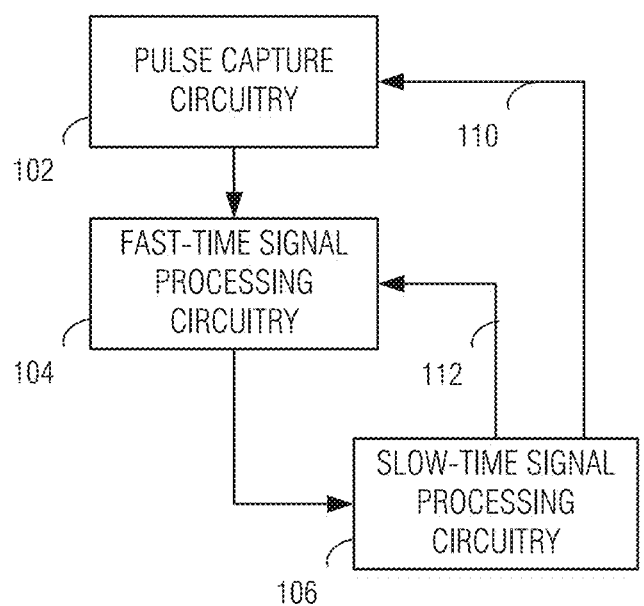
FIG. 1A is a high-level system diagram illustrating a pulse processing system according to some embodiments.

FIG. 1A is a high-level system diagram illustrating a pulse processing system according to some embodiments. As depicted, the system includes pulse capture circuitry 102, fast-time signal processing circuitry 104, and slow-time signal processing circuitry 106, each communicatively coupled to the others. Pulse capture circuitry 102 may include radio receiver circuitry, including such arrangements as super heterodyne circuitry, in-phase and quadrature (I-Q) demodulation circuitry, coordinate rotation digital computer (CORDIC) algorithm implementing circuitry, peak detection, pulse-width measurement circuitry, and the like. Any suitable RF receiver circuitry is contemplated for the various embodiments, whether presently known in the art, or arising in the future. Pulse capture circuitry 102 may also include analog-to-digital conversion circuitry that performs sampling, quantization, and digital encoding operations to interface the RF receiver circuitry with the signal processing circuitry. Pulse capture circuitry 102 captures incoming pulses according to a resource scheduling configuration 110, which may be provided to pulse capture circuitry 102 by slow-time signal processing circuitry 106, for example. Resource scheduling configuration 110 includes one or more directives such as frequency band designations, bandwidth designations, sampling rate designations, and designations of other adjustable parameters of the pulse capture operations.

Fast-time signal processing circuitry 104 is constructed, programmed, or otherwise configured to prioritize captured RF pulses for certain operations, including the slow-time signal processing. The prioritization of the captured RF pulses may be based on dynamic pulse-grading criteria 112, which may be provided to fast-time signal processing circuitry 104 by slow-time signal processing circuitry 106, for example. Incoming RF pulses are compared to the dynamic pulse-grading criteria 112 and, if the criteria 112 are met or exceeded by a given pulse, that pulse is prioritized. Prioritization of pulses may be a simple binary designation of passing/not passing the pulse for further evaluation, or it may be prioritized according to a variable scoring measure. The dynamic pulse-grading criteria 112 are dynamic in the sense that it may be updated, in some embodiments, continuously, to track the current features that are of interest for signal analysis.

Slow-time signal processing circuitry 106 is constructed, programmed, or otherwise configured, to perform relevance evaluation of prioritized RF pulses, and to adjust the dynamic pulse-grading criteria 112 and the resource scheduling configuration 110 based on the relevance evaluation. Slow-time signal processing circuitry 106 may involve higher-order signal analysis, such as a machine-learning system. Various examples are contemplated, such as a Markov model, a hidden Markov model (HMM), or other stochastic system according to one type of embodiment. In another type of embodiment, a supervised machine-learning system, such as an artificial neural network (ANN) may be utilized. Other examples include classification engines, such as a K-nearest neighbor classifier, for instance. Unsupervised machine-learning algorithms may also be used.

In the present context, the terms fast-time and slow-time designate alternative types of signal processing paradigms. These terms are to be juxtaposed with one another, such that fast-time signal processing is fast in comparison to the slow-time signal processing, and the slow-time signal processing is slower than the fast-time signal processing. In practical examples, fast-time signal processing generally refers to real-time or near-real-time processing operations with respect to incoming RF pulses being received, whereas slow-time signal processing generally refers to higher-order processing operations that may not keep up with the received incoming RF pulses. In some embodiments, as evident from the examples provided, fast-time signal processing tends to involve computationally simpler operations than the slow-time signal processing, which may entail more complex algorithms. Also, in related embodiments, fast-time signal processing is handled primarily by lower-level machine implementations, such as using dedicated circuitry or processors running firmware, while the slow-time signal processing may be implemented using higher-level machine implementations such as using computing platforms running system and application software, for example.

In the general topology of the high-level example illustrated in FIG. 1A, two feedback loops are implemented via slow-time signal processing circuitry 106: adjustment of the resource scheduling configuration 110, and adjustment of the dynamic pulse-grading criteria 112. Each of these feedback loops operates to prioritize RF pulses of interest. The resource scheduling configuration 110 facilitates selectivity of certain frequency bands that were found to contain pulses of interest, for example. The dynamic pulse-grading criteria 112 facilitate rapid, computationally-efficient, selection of pulses and related information derived from the pulses, for further processing, while de-prioritizing those items that lack features determined to be of interest. As will be discussed in greater detail below, the dynamic pulse-grading criteria 112 may be applied continuously at various layers of fast-time signal processing, and the criteria 112 may be continuously refined to facilitate a dynamic signal analysis system that adjusts to dynamic signals of interest.

Figure 1B:
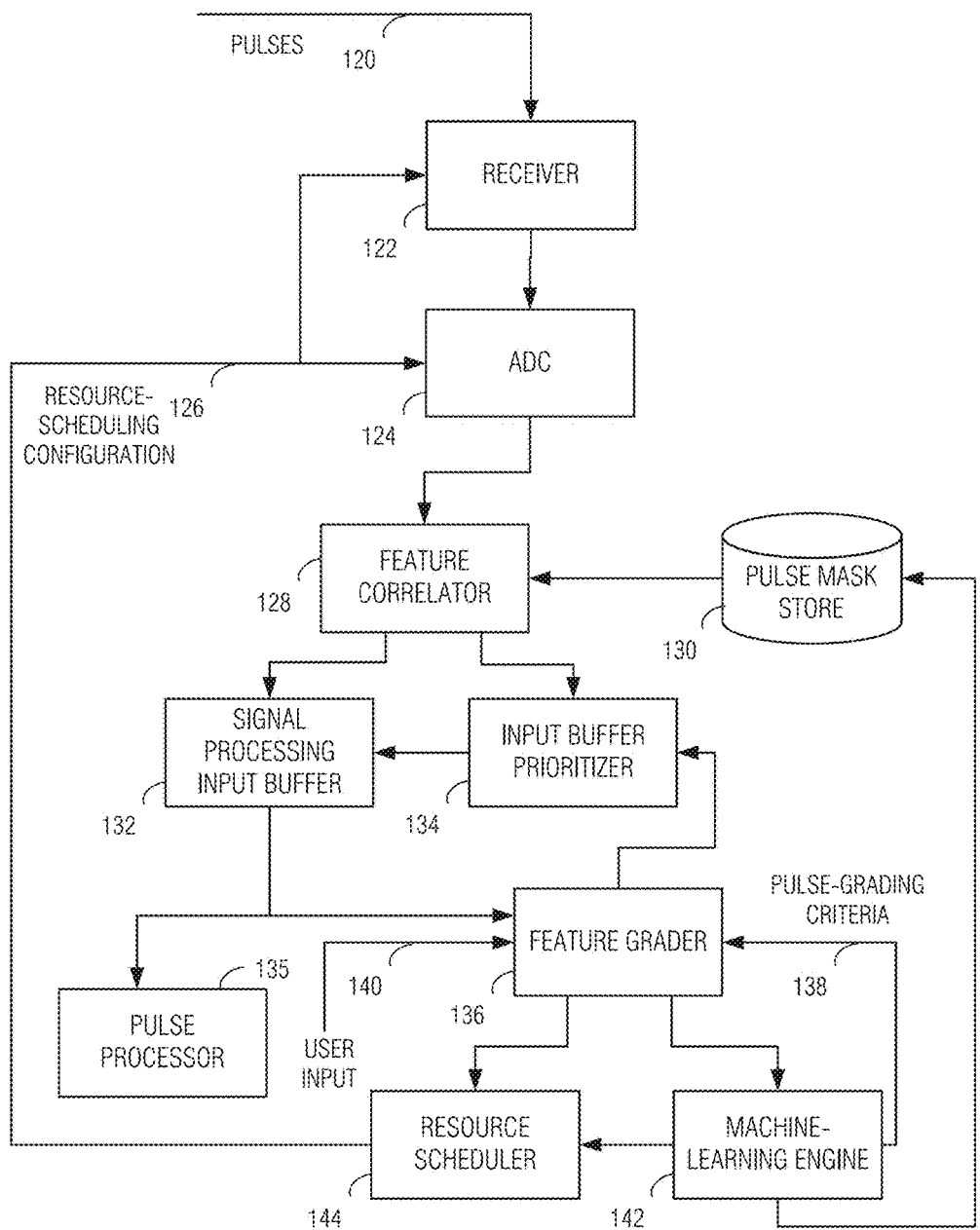
FIG. 1B is a system block diagram illustrating a pulse analyzer system in greater detail according to some embodiments.

FIG. 1B is a system block diagram illustrating a pulse analyzer system in greater detail according to some embodiments. The pulse analyzer system according to these embodiments utilizes an adaptive pulse mask to prioritize incoming pulses. As illustrated, receiver 122 and analog-to-digital converter (ADC) 124 receive and digitize incoming pulses 120 emitted in the RF environment being monitored. One or both of these circuits may be programmable by resource scheduling configuration 126.

The received and digitized pulses are fed to feature correlator 128, which is constructed, programmed, or otherwise configured to extract various predefined features of the pulses and assess correlations between features of various pulses to determine and track one or more emitters of interest. According to some embodiments, feature correlator 128 extracts features such as frequency, bandwidth, pulse width, pulse repetition frequency, I-Q parameters, modulation type, angle of arrival, and the like, and generates pulse descriptor data structures, such as pulse descriptor words (PDWs) for the assessed pulses. As a subsequent layer of correlation, the PDWs are compared to determine any patterns that are indicative of relationships among the PDWs, such as whether certain pulses appear to emanate from a common emitter, such as a RADAR station, communication transmitter, etc. The result of this assessment is an emitter descriptor data structure, such as an emitter descriptor word (EDW) for each suspected emitter. The EDW may include certain features of the PDWs which have been determined to be correlated to a common emitter, for example, along with additional indicia that distinguish the emitter from among other emitters. As a further layer of assessment, the EDWs corresponding to the various emitters are stored in an active emitter data structure, such as an active emitter file (AEF), which maintains and updates features describing a known set of emitters and their various feature sets.

Notably, at each layer of feature extraction and assessment, feature correlator 128 applies pulse masking. Pulse masking according to various embodiments involves comparison of one or more features (or combinations of features) of a pulse (i.e., a feature set) in question with a reference set of values corresponding to the same feature set (with the latter constituting the pulse mask). The pulse mask represents features and their values that have been determined to be of interest. Generally speaking, if the pulse in question has feature values that are similar to those of the pulse mask for that feature set, then the pulse is prioritized for further assessment. To fully assess a pulse in question, a pulse mask may be applied for each corresponding feature. For instance, a first pulse mask may represent pulse amplitude distribution over frequency, whereas a second pulse mask may represent angle of arrival distribution over frequency. A third pulse mask may represent pulse width distribution over frequency, while a fourth pulse mask may represent modulation type distribution over frequency.

In another type of embodiment, a pulse mask may be represented as an N-dimensional array for N features. For example, in a case where N=3, a pulse mask may include frequency, pulse width, and angle of arrival. Each element in the array, contains a grading value based on an assessment of whether or not a feature is of interest, and based on a temporal-proximity weighting of those features of interest. The grading values are adapted over time via a machine-learning algorithm.

The plurality of pulse masks are maintained in pulse mask store 130. When pulses arrive, each feature is extracted, compared to the pulse mask, and assigned a mask-based priority value for each feature. These operations are performed in fast time by feature correlator 128.

Signal processing input buffer 132 stores pulses to be processed in order of priority according to application of the pulse masking. In various embodiments, prioritization of the pulses is based on input buffer prioritizer 134. The overall pulse processing priority depends on the highest cumulative feature priority determined as a result of application of the pulse masking at the various layers of pulse correlation (e.g., PDW, EDW, AEF). High Priority pulses are ordered in signal processing input buffer 132 to be processed first and the lowest priority pulses are ordered to be processed last, provided that there are available processing resources to process the lowest-priority pulses.

Pulse processor 135 analyzes the contents of the filtered pulses. These operations may be performed on the in-phase and quadrature components, I(t), and Q(t), individually according to an example embodiment. Pulse processor 135 may be implemented using a graphics processor unit (GPU), a field-programmable gate array (FPGA), a digital signal processor (DSP), or other suitable signal-processing device or combination of devices.

The pulses are further processed to further refine the pulse masks by feature grader 136. Feature grader 136 applies pulse-grading criteria 138 along with the temporal-proximity weighting such that features deemed "good" in received pulses tend to elevate the grading, and features deemed "bad" tend to suppress the grading score. Pulses that are consecutive are given increased weighting, as will be discussed in greater detail below. As pulses are processed, those found as higher priority receive a positive grade, and vice versa.

In a related embodiment, user input 140 is accepted to provide guidance on the grading of certain features. Feature correlator 128, input buffer prioritizer 134, and feature grader 136 are all processed using fast-time signal processing. On the other hand, pulse processor 135 and machine-learning engine 142 are constructed, programmed, or otherwise configured to perform slow-time processing.

Machine learning engine 142 determines which features are of interest and updates pulse-grading criteria 138 accordingly. As a result, operation of machine-learning engine 142 contributes to the dynamic adaptation of the pulse masking. Machine learning engine 142 may apply any suitable machine-learning algorithm from among known, or future-arising, machine-learning algorithms, according to various embodiments.

Resource scheduler 144 is constructed, programmed, or otherwise configured to supply the resource-scheduling configuration 126 to establish the nature and degree of selectivity of the receiver 122 and ADC 124 to pulses having certain features.

Figure 2:
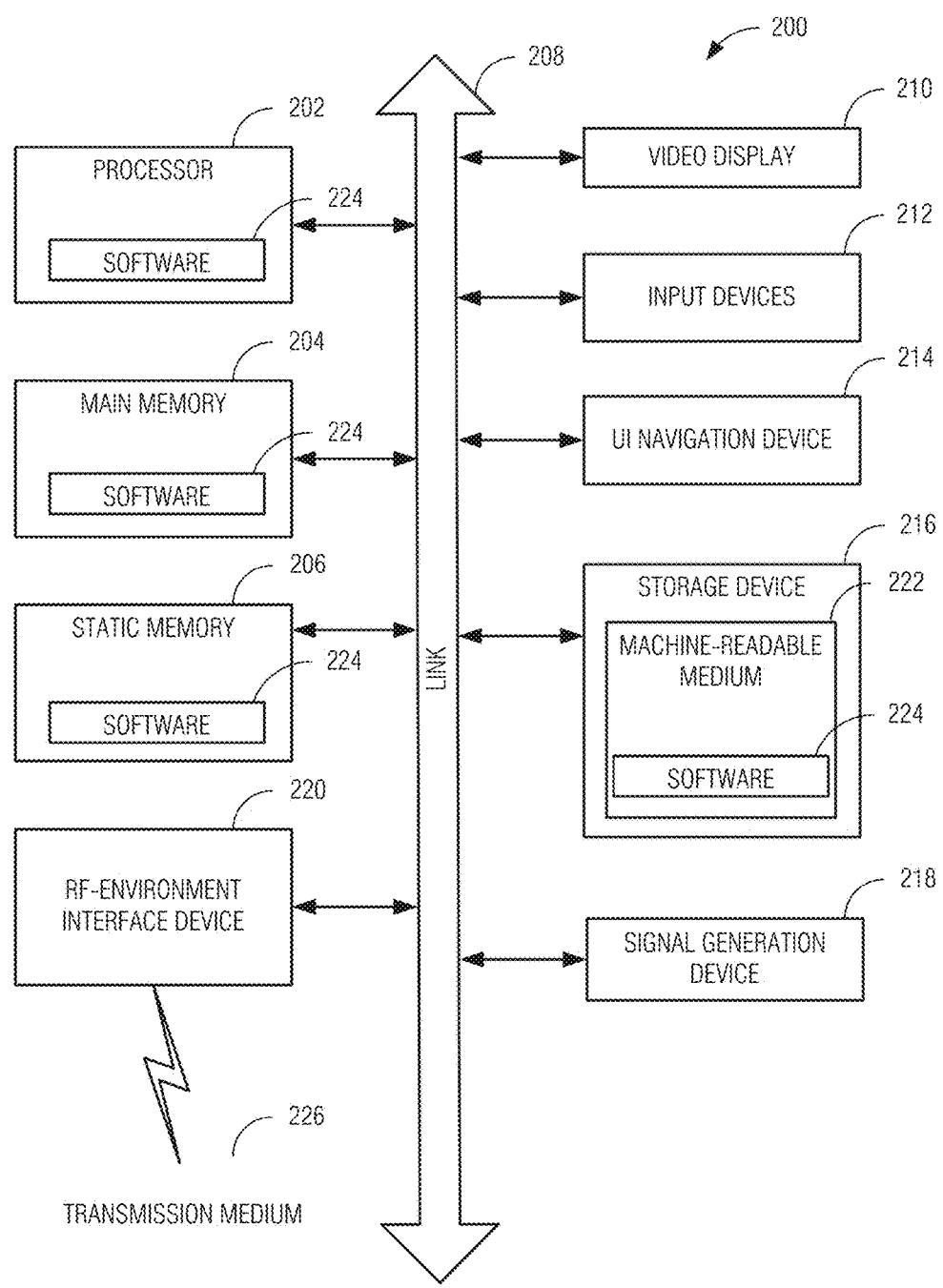
FIG. 2 is a block diagram illustrating a computing platform in the example form of a general-purpose machine.

FIG. 2 is a block diagram illustrating a computing platform 200 in the example form of a general-purpose machine on which some, or all, of the system of FIG. 1A or 1B may be carried out according to some embodiments. In certain embodiments, programming of the computing platform 200 according to one or more particular algorithms produces a special-purpose machine upon execution of that programming. In a networked deployment, the computing platform 200 may operate in the capacity of either a server or a client machine in server-client network environments, or it may act as a peer machine in peer-to-peer (or distributed) network environments. Computing platform 200, or some portions thereof, may represent an example architecture of computing platform 106 or external computing platform 104 according to one type of embodiment.

Example computing platform 200 includes at least one processor 202 (e.g., a central processing unit (CPU), a graphics processing unit (GPU) or both, processor cores, compute nodes, etc.), a main memory 204 and a static memory 206, which communicate with each other via a link 208 (e.g., bus). The computing platform 200 may further include a video display unit 210, input devices 212 (e.g., a keyboard, camera, microphone), and a user interface (UI) navigation device 214 (e.g., mouse, touchscreen). The computing platform 200 may additionally include a storage device 216 (e.g., a drive unit), a signal generation device 218 (e.g., a speaker), and a RF-environment interface device (RFEID) 220.

The storage device 216 includes a machine-readable medium 222 on which is stored one or more sets of data structures and instructions 224 (e.g., software) embodying or utilized by any one or more of the methodologies or functions described herein. The instructions 224 may also reside, completely or at least partially, within the main memory 204, static memory 206, and/or within the processor 202 during execution thereof by the computing platform 200, with the main memory 204, static memory 206, and the processor 202 also constituting machine-readable media.

While the machine-readable medium 222 is illustrated in an example embodiment to be a single medium, the term "machine-readable medium" may include a single medium or multiple media (e.g., a centralized or distributed database, and/or associated caches and servers) that store the one or more instructions 224. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

RFEID 220 includes radio receiver circuitry, along with analog-to-digital conversion circuitry, and interface circuitry to communicate via link 208 according to various embodiments. Various form factors are contemplated for RFEID 220. For instance, RFEID may be in the form of a wideband radio receiver, or scanning radio receiver, that interfaces with processor 202 via link 208. In one example, link 208 includes a PCI Express (PCIe) bus, including a slot into which the NIC form-factor may removably engage. In another embodiment, RFEID 220 includes circuitry laid out on a motherboard together with local link circuitry, processor interface circuitry, other input/output circuitry, memory circuitry, storage device and peripheral controller circuitry, and the like. In another embodiment, RFEID 220 is a peripheral that interfaces with link 208 via a peripheral input/output port such as a universal serial bus (USB) port. RFEID 220 receives RF emissions over wireless transmission medium 226. RFEID 220 may be constructed to receive RADAR signaling, radio communications signaling, unintentional emissions, or some combination of such emissions.

Figure 3:
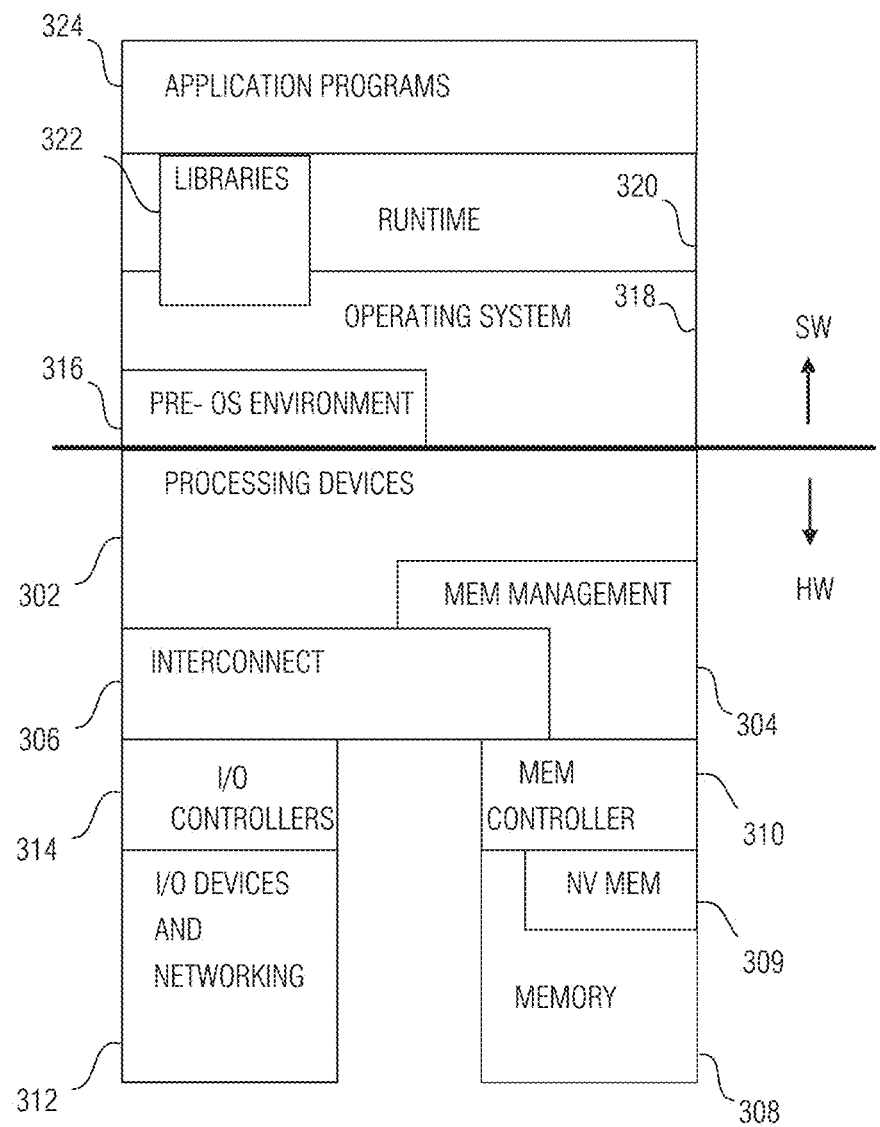
FIG. 3 is a diagram illustrating an exemplary hardware and software architecture of a computing device such as the one depicted in FIG. 2, in which various interfaces between hardware components and software components are shown.

FIG. 3 is a diagram illustrating an exemplary hardware and software architecture of a computing device such as the one depicted in FIG. 2, in which various interfaces between hardware components and software components are shown. As indicated by HW, hardware components are represented below the divider line, whereas software components denoted by SW reside above the divider line. On the hardware side, processing devices 302 (which may include one or more microprocessors, digital signal processors, etc.), each having one or more processor cores, are interfaced with memory management device 304 and system interconnect 306. Memory management device 304 provides mappings between virtual memory used by processes being executed, and the physical memory. Memory management device 304 may be an integral part of a central processing unit which also includes the processing devices 302.

Interconnect 306 includes a backplane such as memory, data, and control lines, as well as the interface with input/output devices, e.g., PCI, USB, etc. Memory 308 (e.g., dynamic random access memory or DRAM) and non-volatile memory 309 such as flash memory (e.g., electrically-erasable read-only memory such as EEPROM, NAND Flash, NOR Flash, etc.) are interfaced with memory management device 304 and interconnect 306 via memory controller 310. This architecture may support direct memory access (DMA) by peripherals in one type of embodiment. I/O devices, including video and audio adapters, non-volatile storage, external peripheral links such as USB, Bluetooth, etc., as well as network interface devices such as those communicating via Wi-Fi or LTE-family interfaces, are collectively represented as I/O devices and networking 312, which interface with interconnect 306 via corresponding I/O controllers 314.

On the software side, a pre-operating system (pre-OS) environment 316 is executed at initial system start-up and is responsible for initiating the boot-up of the operating system. One traditional example of pre-OS environment 316 is a system basic input/output system (BIOS). In present-day systems, a unified extensible firmware interface (UEFI) is implemented. Pre-OS environment 316, is responsible for initiating the launching of the operating system, but also provides an execution environment for embedded applications according to certain aspects of the invention.

Operating system (OS) 318 provides a kernel that controls the hardware devices, manages memory access for programs in memory, coordinates tasks and facilitates multi-tasking, organizes data to be stored, assigns memory space and other resources, loads program binary code into memory, initiates execution of the application program which then interacts with the user and with hardware devices, and detects and responds to various defined interrupts. Also, operating system 318 provides device drivers, and a variety of common services such as those that facilitate interfacing with peripherals and networking, that provide abstraction for application programs so that the applications do not need to be responsible for handling the details of such common operations. Operating system 318 additionally provides a graphical user interface (GUI) engine that facilitates interaction with the user via peripheral devices such as a monitor, keyboard, mouse, microphone, video camera, touchscreen, and the like.

Runtime system 320 implements portions of an execution model, including such operations as putting parameters onto the stack before a function call, the behavior of disk input/output (I/O), and parallel execution-related behaviors. Runtime system 320 may also perform support services such as type checking, debugging, or code generation and optimization.

Libraries 322 include collections of program functions that provide further abstraction for application programs. These include shared libraries and dynamic linked libraries (DLLs), for example. Libraries 322 may be integral to the operating system 318, runtime system 320, or may be added-on features, or even remotely-hosted. Libraries 322 define an application program interface (API) through which a variety of function calls may be made by application programs 324 to invoke the services provided by the operating system 318. Application programs 324 are those programs that perform useful tasks for users, beyond the tasks performed by lower-level system programs that coordinate the basis operability of the computing device itself.

Figure 4:
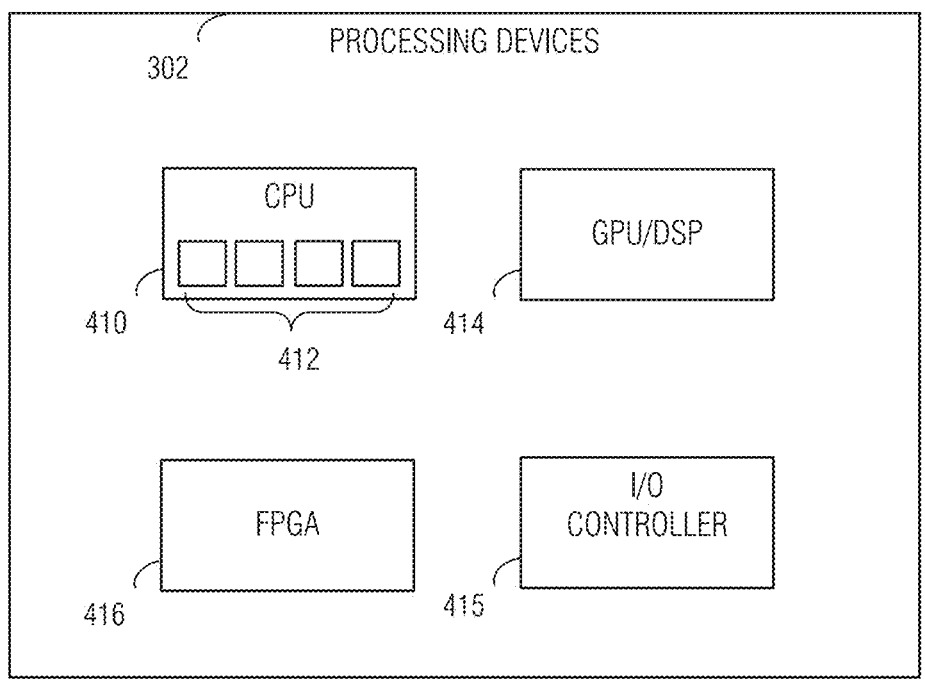
FIG. 4 is a block diagram illustrating examples of processing devices that may be implemented on a computing platform, such as the computing platform described with reference to FIGS. 2-3, according to an embodiment.

FIG. 4 is a block diagram illustrating processing devices 302 according to one type of embodiment. CPU 410 may contain one or more processing cores 412, each of which has one or more arithmetic logic units (ALU), instruction fetch unit, instruction decode unit, control unit, registers, data stack pointer, program counter, and other essential components according to the particular architecture of the processor. As an illustrative example, CPU 410 may be a x86-type of processor. Processing devices 302 may also include a graphics processing unit (GPU) or digital signal processor (DSP) 414. In these embodiments, GPU/DSP 414 may be a specialized co-processor that offloads certain computationally-intensive operations, particularly those associated with numerical computation, from CPU 410. Notably, CPU 410 and GPU/DSP 414 may work collaboratively, sharing access to memory resources, I/O channels, etc.

Processing devices 302 may also include a specialized processor 416, such a field-programmable gate array (FPGA), for example. Specialized processor 416 generally does not participate in the processing work to carry out software code as CPU 410 and GPU 414 may do. In one type of embodiment, specialized processor 416 is configured to execute time-critical operations, such as real-time, or near-real-time signal processing. Specialized processor 416 may execute dedicated firmware. Specialized processor 416 may also include a dedicated set of I/O facilities to enable it to communicate with external entities. Input/output (I/O) controller 415 coordinates information flow between the various processing devices 410, 414, 416, as well as with external circuitry, such as a system interconnect.

Examples, as described herein, may include, or may operate on, logic or a number of components, circuits, or engines, which for the sake of consistency are termed engines, although it will be understood that these terms may be used interchangeably. Engines may be hardware, software, or firmware communicatively coupled to one or more processors in order to carry out the operations described herein. Engines may be hardware engines, and as such engines may be considered tangible entities capable of performing specified operations and may be configured or arranged in a certain manner. In an example, circuits may be arranged (e.g., internally or with respect to external entities such as other circuits) in a specified manner as an engine. In an example, the whole or part of one or more computing platforms (e.g., a standalone, client or server computing platform) or one or more hardware processors may be configured by firmware or software (e.g., instructions, an application portion, or an application) as an engine that operates to perform specified operations. In an example, the software may reside on a machine-readable medium. In an example, the software, when executed by the underlying hardware of the engine, causes the hardware to perform the specified operations. Accordingly, the term hardware engine is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein.

Considering examples in which engines are temporarily configured, each of the engines need not be instantiated at any one moment in time. For example, where the engines comprise a general-purpose hardware processor configured using software; the general-purpose hardware processor may be configured as respective different engines at different times. Software may accordingly configure a hardware processor, for example, to constitute a particular engine at one instance of time and to constitute a different engine at a different instance of time.

Figure 5:
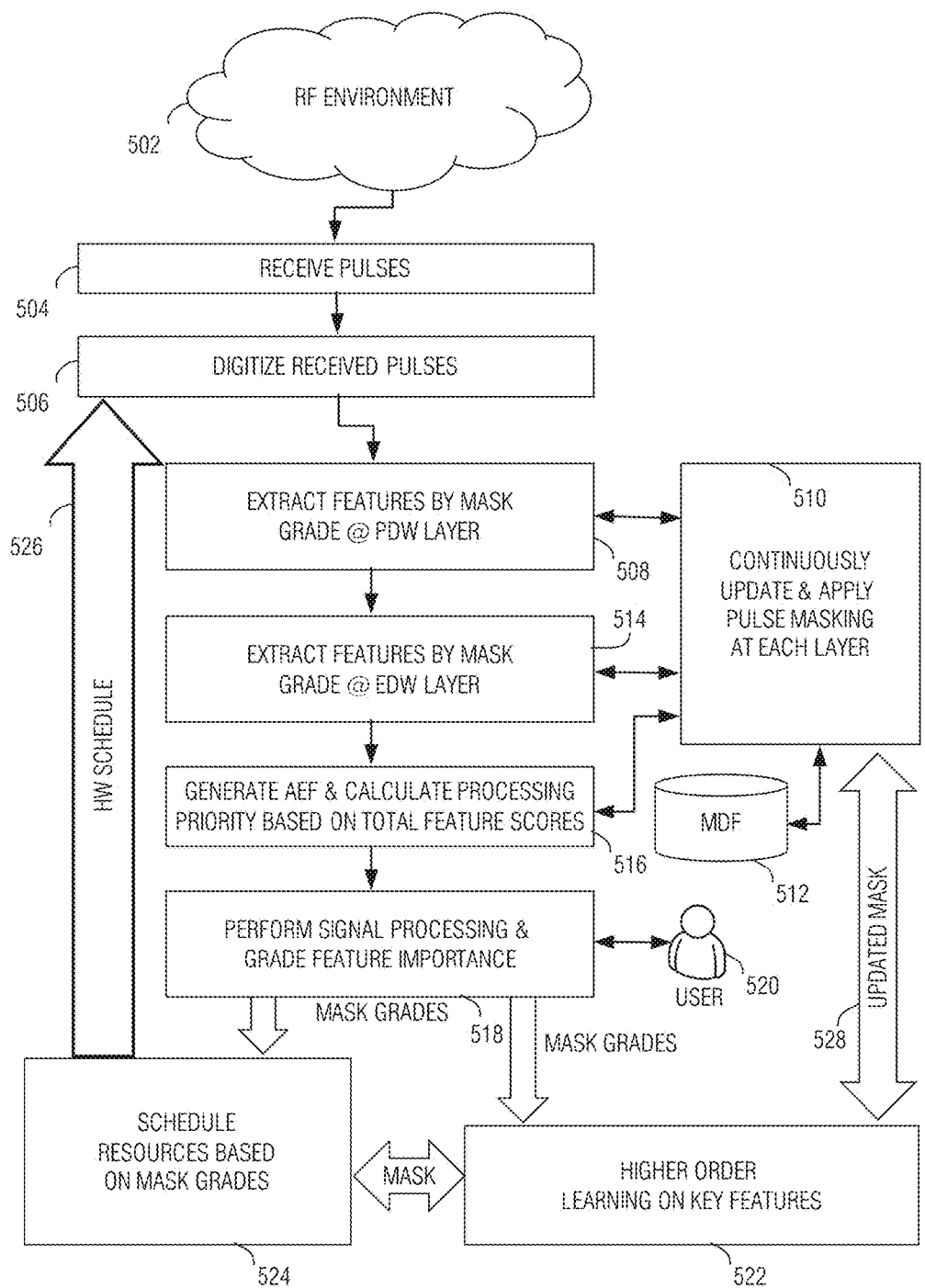
FIG. 5 is a process flow diagram illustrating an example of the operation of a pulse analyzer system according to some embodiments.

FIG. 5 is a process flow diagram illustrating an example of the operation of a pulse analyzer system, such as the system described above with reference to FIGS. 1A-1B according to some embodiments. At 504, receiver 122 of the system receives pulses emitted from within an RF environment 502. At 506 ADC 124 digitizes the received pulses. At 508, feature correlator 128 performs pulse descriptor word (PDW)-layer operations to extract features of the pulses and compare them to corresponding pulse masks at 510. The pulse masks are initially provided from mission data file 512, which may be implemented in pulse mask store 130, though operations at 510 also include continuous updating of the pulse masks. At 514, feature correlator 128 similarly extracts features at an emitter descriptor word (EDW) layer to apply corresponding pulse masking at 510. At 516, the AEF is generated and the pulses are prioritized in signal processing input buffer 132 by input buffer prioritizer 134 based on their highest cumulative feature score according to the application of the pulse masks.

At 518, the pulses are processed by pulse processor 135 in order of their prioritization. Signal processing may involve automated investigation of the signal properties and content, if the latter is accessible. From this information, information about the signals' source and purpose may be inferred. The signal processing operation may be in slow-time. However, since the pulses are prioritized by input buffer prioritizer 134, the computing bottleneck, if any, may be obviated since the pulses are processed in order of decreasing interest. Hence, the available computing resources are applied to process the pulses of greatest importance, as assessed by application of the pulse masking.

Also at 518, feature grader 136 grades the importance of the various features respectively as part of updating the pulse masks. An example of the feature-grading is described in greater detail below with reference to FIG. 6. A user interface may be provided at 520 to obtain user input 140 in regard to the signal processing and the grading of features. User input 140 may provide assistance to the machine learning algorithm in the form of reinforcement (positive or negative) input, from which the machine-learning algorithm may self-adapt to improve accuracy of signal processing or grading for future pulses. For example, a user may identify features of interest, adjust weighting of filters, define or redefine prioritization criteria, and the like.

At 522, higher-order learning operations are carried out. These may include stochastic-type machine learning, as well as neural-network, classification, association rule mining, clustering, support vector machine, or other machine-learning mechanism, whether supervised or unsupervised, according to various embodiments. At 524, resource scheduling is performed based on the updated pulse mask grades. For example, frequency bands of greater interest may be identified as corresponding to frequent incidence of other features deemed important, such as pulse width, angle of arrival, modulation type, etc. These frequency bands may be specified for preferential listening by the pulse reception hardware. The hardware resource scheduling feedback is indicated at 526. At 528, results of the higher-order learning are used to further update the pulse masks.

Figure 6:
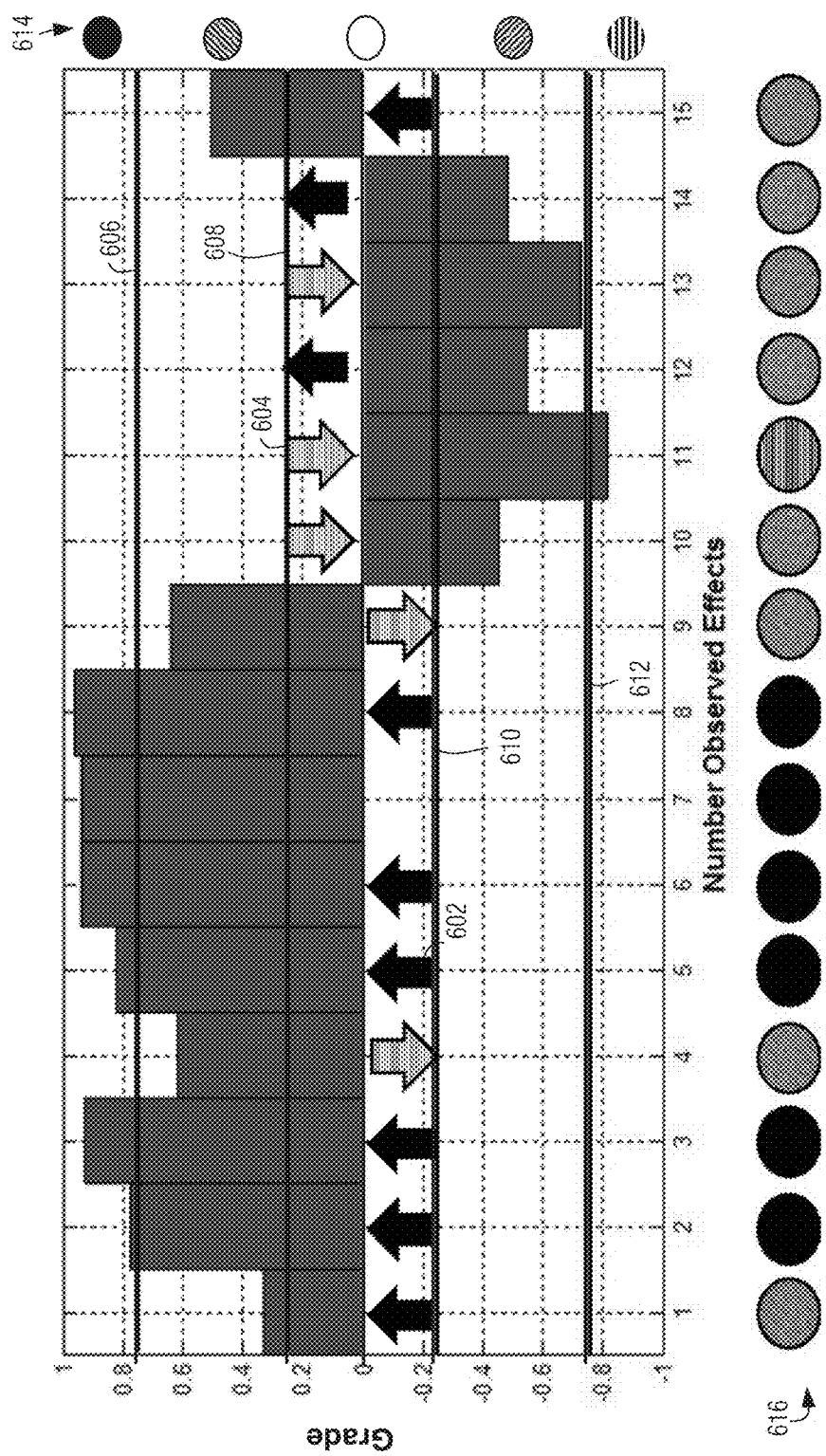
FIG. 6 is a diagram illustrating a feature-grading algorithm according to an example embodiment.

FIG. 6 is a diagram illustrating a feature-grading algorithm according to an example embodiment. The grading algorithm uses a temporal proximity weighting approach to rapidly converge the feature grade to a value. As depicted, the horizontal axis represents the passage of time. Here, each increment along the horizontal axis is an observed effect of an analyzed pulse. The observed effect may be considered to be "good" or "bad" in terms of its impact on the relevance of the feature. Good effects are indicated by the upward-pointing arrows such as arrow 602, whereas bad effects are represented by the downward-facing arrows such as arrow 604. For each observed effect, an adjustment of the grade is made. The grading in this example is in the numerical range of −1 to 1, with positive values corresponding to good feature effects—i.e., the feature is deemed to be relevant; and negative values corresponding to bad feature effects—i.e., the feature is deemed not relevant.

According to an example set of decision logic, if the number of times the feature within the region is assessed as interesting is 1, then the value increases by: 0.33*(1−currentScore). If the number of times the feature within the region is assessed as interesting is greater than 1, then the value increases by: 0.66*(1−currentScore). If the number of times the feature within the region is assessed as NOT interesting is 1, then the value decreases by: abs(0.33*(−1+currentScore)). If the number of times the feature within the region is assessed as interesting is greater than 1, then the value increases by: abs(0.66*(−1+currentScore)).

These scores are tracked over time and used as priorities for processing and scheduling resources. Advantageously, this algorithm is relatively lightweight and only uses the most recent value from which the next value is determined upon receiving a new observed effect.

This example algorithm quickly adapts to changes in feature importance. As can be seen in FIG. 6, one change in importance assessment does not appreciably affect the overall score; however, a second consecutive importance assessment of the same polarity as the preceding one produces a dramatic effect.

Also depicted in FIG. 6 are category thresholds 606, 608, 610, and 612. Threshold 606 is at 0.75; threshold 608 is at 0.25; threshold 610 is at −0.25; and threshold 612 is at −0.75. Thus, five classifications are defined: GREAT (x>=0.75); GOOD (0.25<=x<0.75); FAIR (−0.25<=x<0.25); POOR (−0.75<=x<−0.25); and BAD (x<=−0.75). Each category is marked with a corresponding shading pattern as indicated at 614. The categorizations for the example grading is indicated at 616.

FIGS. 7A-7B present source code as an example of the feature-grading algorithm according to an embodiment. This example implements an expansion of a Newtonian growth/decay algorithm for grading significance of signal features. If a signal is deemed to be of interest, a positive grade is applied, while if a signal is deemed insignificant, a negative grade is applied. Grades are compounded in response to multiple occurrences to accelerate the convergence to a particular classification score. Advantageously, this approach facilitates rapid responsiveness to signals that exhibit variable relevance.

Figure 8:
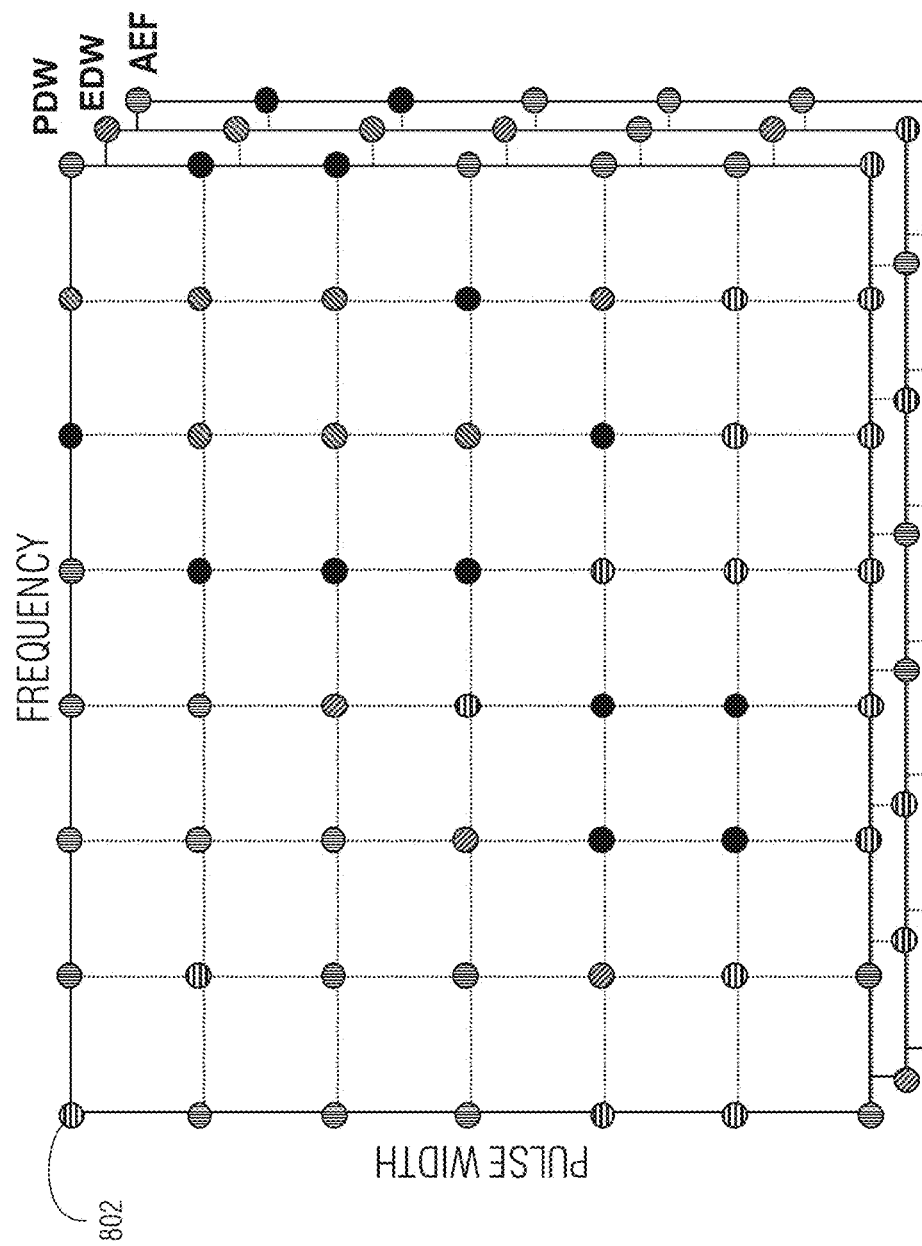
FIG. 8 illustrates an example set of pulse masks for the feature of pulse width over frequency.

FIG. 8 illustrates an example set of pulse masks for the feature of pulse width over frequency. The pulse masks are depicted as 2-D arrays in this example, with each cell of the array corresponding to a particular pulse width value (rounded) at a particular frequency (rounded). Each cell represents a grading point, such as grading point 802. Each grading point has a value corresponding to a determined categorization using an feature-grading algorithm such as the one described above with reference to FIGS. 6 and 7A-7B. Notably, there are separate pulse masks for the various feature-extraction layers of PDW, EDW, and AEF.

In an example embodiment, each grading point has a grade applied to it which is adapted over time via machine learning. When pulses arrive, the feature is extracted, compared to the mask, and assigned a mask-based priority value for each feature, in fast time. The overall pulse processing priority depends on the highest cumulative feature priority. High-priority pulses are processed first and the lowest priority pulses are processed last. As pulses are processed, those found as higher priority receive a positive grade, and vice versa. Updating of the mask may be based on a combination of higher-order processing learning algorithmic feedback, operator-provided feedback, and signal processing feedback. The mapping is continuously updated throughout a mission, and resources are scheduled to focus on highly scored features.

ADDITIONAL NOTES & EXAMPLES

Example 1 is a radio-frequency (RF) signal analyzer for analyzing RF pulses, the RF signal analyzer comprising: pulse capture circuitry to capture incoming RF pulses according to a resource scheduling configuration and to store captured RF pulses; fast-time signal processing circuitry, and slow-time signal processing circuitry, wherein: the fast-time signal processing circuitry is to prioritize the captured RF pulses for slow-time signal processing based on dynamic pulse-grading criteria; and the slow-time signal processing is to perform relevance evaluation of the prioritized RF pulses, and to adjust the dynamic pulse-grading criteria and the resource scheduling configuration based on the relevance evaluation.

In Example 2, the subject matter of Example 1 optionally includes wherein the fast-time signal processing circuitry includes a feature correlator to extract various predefined features of the RF pulses and assess correlations between features of the RF pulses to determine one or more emitters of interest.

In Example 3, the subject matter of Example 2 optionally includes wherein the feature correlator is to generate: pulse descriptor data structures, each pulse descriptor data structure based on extracted features of a corresponding RF pulse; an emitter descriptor data structure based on detected correlations of features of various pulse descriptor data structures corresponding to different pulses; and an active emitter data structure based on a plurality of emitter descriptor data structures.

In Example 4, the subject matter of any one or more of Examples 1-3 optionally include wherein the fast-time signal processing circuitry includes a pulse mask store containing feature set-specific pulse masks, wherein each pulse mask represents pulse features and values of the pulse features that are relevant for analysis of the RF pulses.

In Example 5, the subject matter of Example 4 optionally includes wherein each pulse mask is to be compared against a RF pulse descriptor data structure to assess whether a corresponding feature set of the RF pulse is relevant for analysis of the pulse.

In Example 6, the subject matter of any one or more of Examples 4-5 optionally include wherein each pulse mask is represented as an N-dimensional array representing N pulse features, wherein N is greater than one.

In Example 7, the subject matter of Example 6 optionally includes wherein N is equal to two.

In Example 8, the subject matter of any one or more of Examples 4-7 optionally include wherein each pulse mask represents a pulse feature distribution over a spectrum of frequencies.

In Example 9, the subject matter of any one or more of Examples 4-8 optionally include a feature grader to apply pulse-grading criteria to update at least one of the pulse masks based on temporal proximity weighting of relevance at least one corresponding feature of the RF pulses.

In Example 10, the subject matter of any one or more of Examples 1-9 optionally include wherein the fast-time signal processing circuitry includes: a signal processing input buffer to store RF pulse information for pulses to be processed; and an input buffer prioritizer to reorder the RF pulse information according to assessed relevance of the RF pulses.

In Example 11, the subject matter of any one or more of Examples 1-10 optionally include wherein the slow-time signal processing circuitry includes a machine-learning engine to determine relevance of features of the RF pulses according to at least one machine-learning algorithm.

Example 12 is an automated method for analyzing radio-frequency (RF) pulses, the method comprising: capturing incoming RF pulses according to a resource scheduling configuration; storing captured RF pulses; applying fast-time signal processing to perform prioritizing of the captured RF pulses for slow-time signal processing based on dynamic pulse-grading criteria applied via fast-time signal processing; performing relevance evaluation of the prioritized RF pulses via the slow-time signal processing; and adjusting the dynamic pulse-grading criteria and the resource scheduling configuration based on the relevance evaluation.

In Example 13, the subject matter of Example 12 optionally includes wherein in the fast-time signal processing, various predefined features of the RF pulses are extracted and correlations between features of the RF pulses are assessed to determine one or more emitters of interest.

In Example 14, the subject matter of Example 13 optionally includes wherein the fast-time signal processing includes storing: pulse descriptor data structures, each pulse descriptor data structure based on extracted features of a corresponding RF pulse; an emitter descriptor data structure based on detected correlations of features of various pulse descriptor data structures corresponding to different pulses; and an active emitter data structure based on a plurality of emitter descriptor data structures.

In Example 15, the subject matter of any one or more of Examples 12-14 optionally include wherein the fast-time signal processing includes storing feature set-specific pulse masks, wherein each pulse mask represents pulse features and values of the pulse features that are relevant for analysis of the RF pulses.

In Example 16, the subject matter of Example 15 optionally includes wherein each pulse mask is compared against a RF pulse descriptor data structure to assess whether a corresponding feature set of the RF pulse is relevant for analysis of the pulse.

In Example 17, the subject matter of any one or more of Examples 15-16 optionally include wherein each pulse mask is represented as an N-dimensional array representing N pulse features, wherein N is greater than one.

In Example 18, the subject matter of Example 17 optionally includes wherein N is equal to two.

In Example 19, the subject matter of any one or more of Examples 15-18 optionally include wherein each pulse mask represents a pulse feature distribution over a spectrum of frequencies.

In Example 20, the subject matter of any one or more of Examples 15-19 optionally include applying pulse-grading criteria to update at least one of the pulse masks based on temporal proximity weighting of relevance at least one corresponding feature of the RF pulses.

In Example 21, the subject matter of any one or more of Examples 12-20 optionally include wherein the fast-time signal processing includes: storing RF pulse information for pulses to be processed; and reordering the RF pulse information according to assessed relevance of the RF pulses.

In Example 22, the subject matter of any one or more of Examples 12-21 optionally include wherein the slow-time signal processing includes determining relevance of features of the RF pulses according to at least one machine-learning algorithm.

Example 23 is a set of at least one non-transitory machine-readable medium containing instructions that, when executed by signal-processing equipment, cause the signal-processing equipment to: capture incoming RF pulses according to a resource scheduling configuration; store captured RF pulses; apply fast-time signal processing to perform prioritizing of the captured RF pulses for slow-time signal processing based on dynamic pulse-grading criteria applied via fast-time signal processing; perform relevance evaluation of the prioritized RF pulses via the slow-time signal processing; and adjust the dynamic pulse-grading criteria and the resource scheduling configuration based on the relevance evaluation.

In Example 24, the subject matter of Example 23 optionally includes wherein in the fast-time signal processing, various predefined features of the RF pulses are extracted and correlations between features of the RF pulses are assessed to determine one or more emitters of interest.

In Example 25, the subject matter of Example 24 optionally includes wherein the fast-time signal processing includes storing: pulse descriptor data structures, each pulse descriptor data structure based on extracted features of a corresponding RF pulse; an emitter descriptor data structure based on detected correlations of features of various pulse descriptor data structures corresponding to different pulses; and an active emitter data structure based on a plurality of emitter descriptor data structures.

In Example 26, the subject matter of any one or more of Examples 23-25 optionally include wherein the fast-time signal processing includes storing feature set-specific pulse masks, wherein each pulse mask represents pulse features and values of the pulse features that are relevant for analysis of the RF pulses.

In Example 27, the subject matter of Example 26 optionally includes wherein each pulse mask is compared against a RF pulse descriptor data structure to assess whether a corresponding feature set of the RF pulse is relevant for analysis of the pulse.

In Example 28, the subject matter of any one or more of Examples 26-27 optionally include wherein each pulse mask is represented as an N-dimensional array representing N pulse features, wherein N is greater than one.

In Example 29, the subject matter of Example 28 optionally includes wherein N is equal to two.

In Example 30, the subject matter of any one or more of Examples 26-29 optionally include wherein each pulse mask represents a pulse feature distribution over a spectrum of frequencies.

In Example 31, the subject matter of any one or more of Examples 26-30 optionally include instructions that, when executed by signal-processing equipment, cause the signal-processing equipment to apply pulse-grading criteria to update at least one of the pulse masks based on temporal proximity weighting of relevance at least one corresponding feature of the RF pulses.

In Example 32, the subject matter of any one or more of Examples 23-31 optionally include wherein the fast-time signal processing includes: storing RF pulse information for pulses to be processed; and reordering the RF pulse information according to assessed relevance of the RF pulses.

In Example 33, the subject matter of any one or more of Examples 23-32 optionally include wherein the slow-time signal processing includes determining relevance of features of the RF pulses according to at least one machine-learning algorithm.

Example 34 is a system for analyzing radio-frequency (RF) pulses, the system comprising: means for capturing incoming RF pulses according to a resource scheduling configuration; means for storing captured RF pulses: fast-time signal processing means for prioritizing the captured RF pulses for processing by means for slow-time signal processing based on dynamic pulse-grading criteria applied via fast-time signal processing; means for performing relevance evaluation of the prioritized RF pulses via the means for slow-time signal processing; and means for adjusting the dynamic pulse-grading criteria and the resource scheduling configuration based on the relevance evaluation.

In Example 35, the subject matter of Example 34 optionally includes wherein the fast-time signal processing means include means for extracting various predefined features of the RF pulses; and means for assessing correlations between features of the RF pulses to determine one or more emitters of interest.

In Example 36, the subject matter of Example 35 optionally includes wherein the fast-time signal processing means include means for storing: pulse descriptor data structures, each pulse descriptor data structure based on extracted features of a corresponding RF pulse; an emitter descriptor data structure based on detected correlations of features of various pulse descriptor data structures corresponding to different pulses; and an active emitter data structure based on a plurality of emitter descriptor data structures.

In Example 37, the subject matter of any one or more of Examples 34-36 optionally include wherein the fast-time signal processing means include storing feature set-specific pulse masks, wherein each pulse mask represents pulse features and values of the pulse features that are relevant for analysis of the RF pulses.

In Example 38, the subject matter of Example 37 optionally includes wherein each pulse mask is compared against a RF pulse descriptor data structure to assess whether a corresponding feature set of the RF pulse is relevant for analysis of the pulse.

In Example 39, the subject matter of any one or more of Examples 37-38 optionally include wherein each pulse mask is represented as an N-dimensional array representing N pulse features, wherein N is greater than one.

In Example 40, the subject matter of Example 39 optionally includes wherein N is equal to two.

In Example 41, the subject matter of any one or more of Examples 37-40 optionally include wherein each pulse mask represents a pulse feature distribution over a spectrum of frequencies.

In Example 42, the subject matter of any one or more of Examples 37-41 optionally include means for applying pulse-grading criteria to update at least one of the pulse masks based on temporal proximity weighting of relevance at least one corresponding feature of the RF pulses.

In Example 43, the subject matter of any one or more of Examples 34-42 optionally include wherein the fast-time signal processing means include: means for storing RF pulse information for pulses to be processed, and means for reordering the RF pulse information according to assessed relevance of the RF pulses.

In Example 44, the subject matter of any one or more of Examples 34-43 optionally include wherein the means for slow-time signal processing include means for determining relevance of features of the RF pulses according to at least one machine-learning algorithm.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A radio-frequency (RF) signal analyzer for analyzing RF pulses, the RF signal analyzer comprising:
   pulse capture circuitry to capture incoming RF pulses according to a resource scheduling configuration and to store captured RF pulses; and
   signal-processing circuitry including fast-time signal processing circuitry and slow-time signal processing circuitry, wherein:
   the fast-time signal processing circuitry is to prioritize the captured RF pulses for slow-time signal processing based on application of feature set-specific pulse masks and dynamic pulse-grading criteria, wherein each of the pulse masks represents pulse features and values of the pulse features that are relevant for analysis of the RF pulses; and
   the slow-time signal processing is to perform relevance evaluation of the prioritized RF pulses, and to adjust the dynamic pulse-grading criteria and the resource scheduling configuration based on the relevance evaluation.

2. The RF signal analyzer of claim 1, wherein the fast-time signal processing circuitry includes a feature correlator to extract various predefined features of the RF pulses and assess correlations between features of the RF pulses to determine one or more emitters of interest.

3. The RF signal analyzer of claim 2, wherein the feature correlator is to generate:
   pulse descriptor data structures, each pulse descriptor data structure based on extracted features of a corresponding RF pulse;
   an emitter descriptor data structure based on detected correlations of features of various pulse descriptor data structures corresponding to different pulses; and
   an active emitter data structure based on a plurality of emitter descriptor data structures.

4. The RF signal analyzer of claim 1, wherein the fast-time signal processing circuitry includes a pulse mask store containing the feature set-specific pulse masks.

5. The RF signal analyzer of claim 4, wherein each pulse mask is to be compared against a RF pulse descriptor data structure to assess whether a corresponding feature set of the RF pulse is relevant for analysis of the pulse.

6. The RF signal analyzer of claim 4, wherein each pulse mask is represented as an N-dimensional array representing N pulse features, wherein N is greater than one.

7. The RF signal analyzer of claim 6, wherein N is equal to two.

8. The RF signal analyzer of claim 4, wherein each pulse mask represents a pulse feature distribution over a spectrum of frequencies.

9. The RF signal analyzer of claim 4, further comprising:
   a feature grader to apply pulse-grading criteria to update at least one of the pulse masks based on temporal proximity weighting of relevance at least one corresponding feature of the RF pulses.

10. The RF signal analyzer of claim 1, wherein the fast-time signal processing circuitry includes:
    a signal processing input buffer to store RF pulse information for pulses to be processed; and
    an input buffer prioritizer to reorder the RF pulse information according to assessed relevance of the RF pulses.

11. The RF signal analyzer of claim 1, wherein the slow-time signal processing circuitry includes a machine-learning engine to determine relevance of features of the RF pulses according to at least one machine-learning algorithm.

12. An automated method for analyzing radio-frequency (RF) pulses, the method comprising:
capturing incoming RF pulses according to a resource scheduling configuration;
storing the captured RF pulses;
applying fast-time signal processing to perform prioritizing of the captured RF pulses for slow-time signal processing based on application of feature set-specific pulse masks and dynamic pulse-grading criteria, wherein each of the pulse masks represents pulse features and values of the pulse features that are relevant for analysis of the RF pulses;
performing relevance evaluation of the prioritized RF pulses via the slow-time signal processing; and
adjusting the dynamic pulse-grading criteria and the resource scheduling configuration based on the relevance evaluation.

13. The method of claim 12, wherein in the fast-time signal processing, various predefined features of the RF pulses are extracted and correlations between features of the RF pulses are assessed to determine one or more emitters of interest.

14. The method of claim 12, wherein the fast-time signal processing includes storing the feature set-specific pulse masks.

15. The method of claim 12, wherein the fast-time signal processing includes:
storing RF pulse information for pulses to be processed; and
reordering the RF pulse information according to assessed relevance of the RF pulses.

16. A set of at least one non-transitory machine-readable medium containing instructions that, when executed by signal-processing equipment, cause the signal-processing equipment to:
capture incoming RF pulses according to a resource scheduling configuration;
store the captured RF pulses;
apply fast-time signal processing to perform prioritizing of the captured RF pulses for slow-time signal processing based on application of feature set-specific pulse masks and dynamic pulse-grading criteria, wherein each of the pulse masks represents pulse features and values of the pulse features that are relevant for analysis of the RF pulses;
perform relevance evaluation of the prioritized RF pulses via the slow-time signal processing; and
adjust the dynamic pulse-grading criteria and the resource scheduling configuration based on the relevance evaluation.

17. The set of at least one machine-readable medium of claim 16, wherein in the fast-time signal processing, various predefined features of the RF pulses are extracted and correlations between features of the RF pulses are assessed to determine one or more emitters of interest.

18. The set of at least one machine-readable medium of claim 16, wherein the fast-time signal processing includes storing the feature set-specific pulse masks.

19. The set of at least one machine-readable medium of claim 18, wherein each pulse mask is compared against a RF pulse descriptor data structure to assess whether a corresponding feature set of the RF pulse is relevant for analysis of the pulse.

20. The set of at least one machine-readable medium of claim 18, wherein each pulse mask is represented as an N-dimensional array representing N pulse features, wherein N is greater than one.

21. The set of at least one machine-readable medium of claim 20, wherein N is equal to two.

22. The set of at least one machine-readable medium of claim 18, wherein each pulse mask represents a pulse feature distribution over a spectrum of frequencies.

23. The set of at least one machine-readable medium of claim 18, further comprising:
instructions that, when executed by signal-processing equipment, cause the signal-processing equipment to apply pulse-grading criteria to update at least one of the pulse masks based on temporal proximity weighting of relevance at least one corresponding feature of the RF pulses.

24. The set of at least one machine-readable medium of claim 16, wherein the fast-time signal processing includes:
storing RF pulse information for pulses to be processed; and
reordering the RF pulse information according to assessed relevance of the RF pulses.

25. A system for analyzing radio-frequency (RF) pulses, the system comprising:
circuitry to capture incoming RF pulses according to a resource scheduling configuration;
memory to store the captured RF pulses; and
processing circuitry:
to perform fast-time signal processing to prioritize the captured RF pulses;
to perform slow-time signal processing based on application of feature set-specific pulse masks and dynamic pulse-grading criteria, wherein each of the pulse masks represents pulse features and values of the pulse features that are relevant for analysis of the RF pulses;
to perform a relevance evaluation of the prioritized RF pulses based on the slow-time signal processing; and
to adjust the dynamic pulse-grading criteria and the resource scheduling configuration based on the relevance evaluation.

* * * * *

UNITED STATES PATENT AND TRADEMARK OFFICE
CERTIFICATE OF CORRECTION

PATENT NO. : 10,393,784 B2
APPLICATION NO. : 15/497554
DATED : August 27, 2019
INVENTOR(S) : Logan et al.

Page 1 of 1

It is certified that error appears in the above-identified patent and that said Letters Patent is hereby corrected as shown below:

In the Specification

In Column 14, Line 14, delete "pulses:" and insert --pulses;-- therefor

In Column 15, Line 1, delete "processed," and insert --processed;-- therefor

Signed and Sealed this
Third Day of November, 2020

Andrei Iancu
*Director of the United States Patent and Trademark Office*